US008022728B2

(12) United States Patent
Kanda et al.

(10) Patent No.: US 8,022,728 B2
(45) Date of Patent: Sep. 20, 2011

(54) COMMON-MODE VOLTAGE CONTROLLER

(75) Inventors: Kouichi Kanda, Kawasaki (JP); Satoshi Matsubara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/049,879

(22) Filed: Mar. 17, 2008

(65) Prior Publication Data

US 2008/0224776 A1 Sep. 18, 2008

Related U.S. Application Data

(63) Continuation of application No. PCT/JP2005/017197, filed on Sep. 16, 2005.

(51) Int. Cl.
*H03K 19/0175* (2006.01)
(52) U.S. Cl. ............ 326/83; 326/86; 326/115; 327/108; 327/109; 330/259
(58) Field of Classification Search ................ 330/9, 85, 330/253–261, 310, 295; 326/30, 81–87, 326/115, 121, 127; 327/108, 110–112, 307, 327/65
See application file for complete search history.

(56) References Cited

U.S. PATENT DOCUMENTS

| | | | |
|---|---|---|---|
| 6,081,162 A * | 6/2000 | Johnson | 330/301 |
| 6,288,604 B1 * | 9/2001 | Shih et al. | 330/9 |
| 6,504,404 B2 | 1/2003 | Uchiki et al. | |
| 6,507,241 B1 * | 1/2003 | Ritter | 330/9 |
| 6,580,324 B2 * | 6/2003 | Palaskas et al. | 330/258 |
| 6,583,746 B2 | 6/2003 | Tokioka | |
| 6,873,209 B2 | 3/2005 | Takata et al. | |
| 6,946,907 B2 * | 9/2005 | Tai | 330/69 |
| 6,998,917 B2 * | 2/2006 | Kudo et al. | 330/258 |
| 7,098,699 B2 * | 8/2006 | Tamura et al. | 327/108 |
| 7,619,448 B2 * | 11/2009 | Wu et al. | 327/108 |
| 2002/0190754 A1 | 12/2002 | Brunolli | |

FOREIGN PATENT DOCUMENTS

| | | |
|---|---|---|
| JP | 2000-196680 A | 7/2000 |
| JP | 2002-314398 A | 10/2002 |
| JP | 2003-152538 A | 5/2003 |
| JP | 2004-172980 A | 6/2004 |
| JP | 2004-343277 A | 12/2004 |

* cited by examiner

*Primary Examiner* — Shawki Ismail
*Assistant Examiner* — Christopher Lo
(74) *Attorney, Agent, or Firm* — Arent Fox LLP

(57) ABSTRACT

A common-mode voltage controller for adjusting common-mode voltages between a first buffer and a second buffer at a subsequent stage or a preceding stage of the first buffer in a signal transmission circuit, comprising: a first reference voltage generation unit for generating a common-mode voltage corresponding to the first buffer; a second reference voltage generation unit for generating a common-mode voltage corresponding to the second buffer at the subsequent stage or the preceding stage; and a control signal generation unit for generating a control signal for controlling a common-mode voltage of the first buffer according to a difference voltage between an output of the first reference voltage generation unit and an output of the second reference voltage generation unit, and giving the control signal to the first buffer and first reference voltage generation unit.

8 Claims, 17 Drawing Sheets

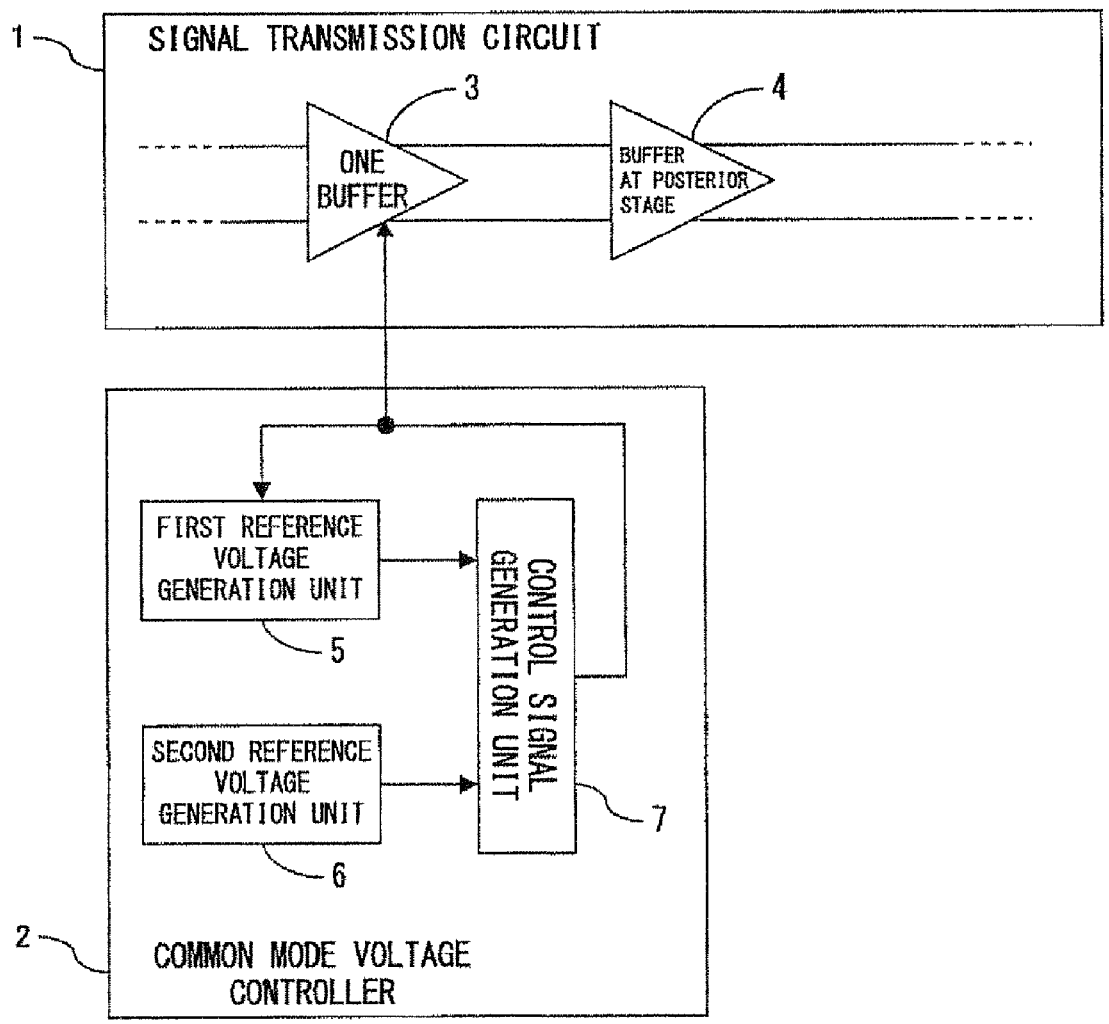
F I G. 1

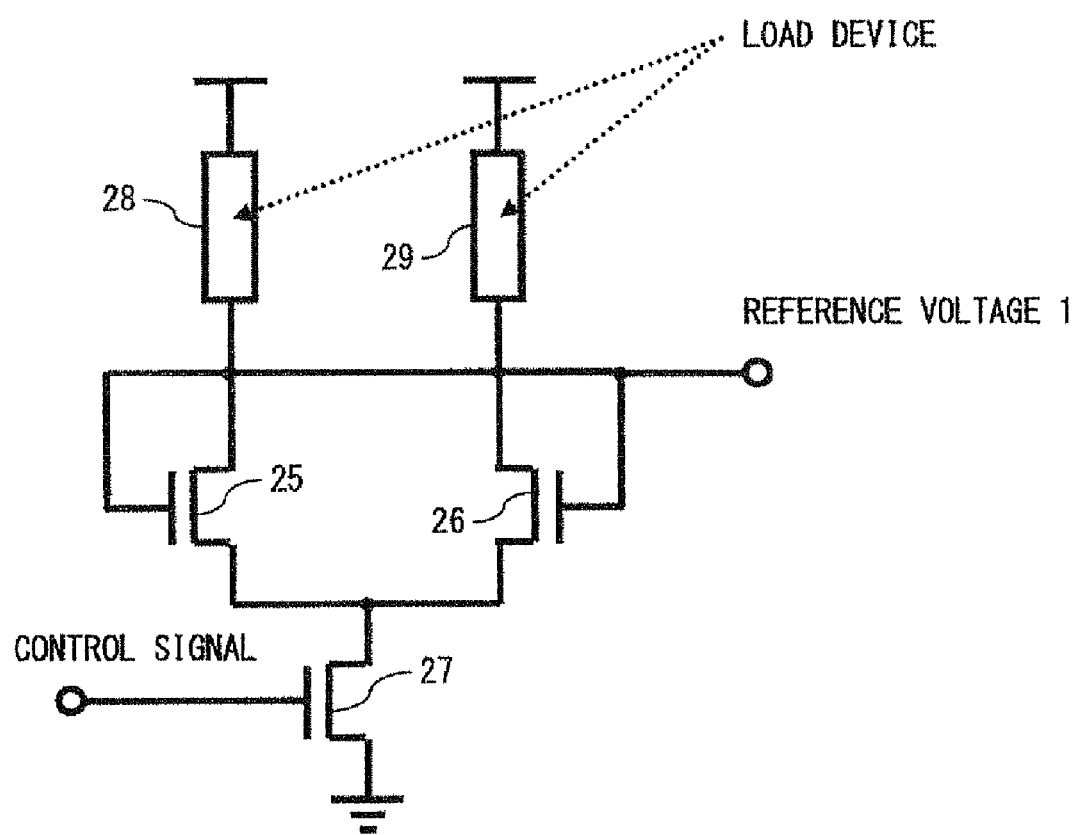
F I G. 6

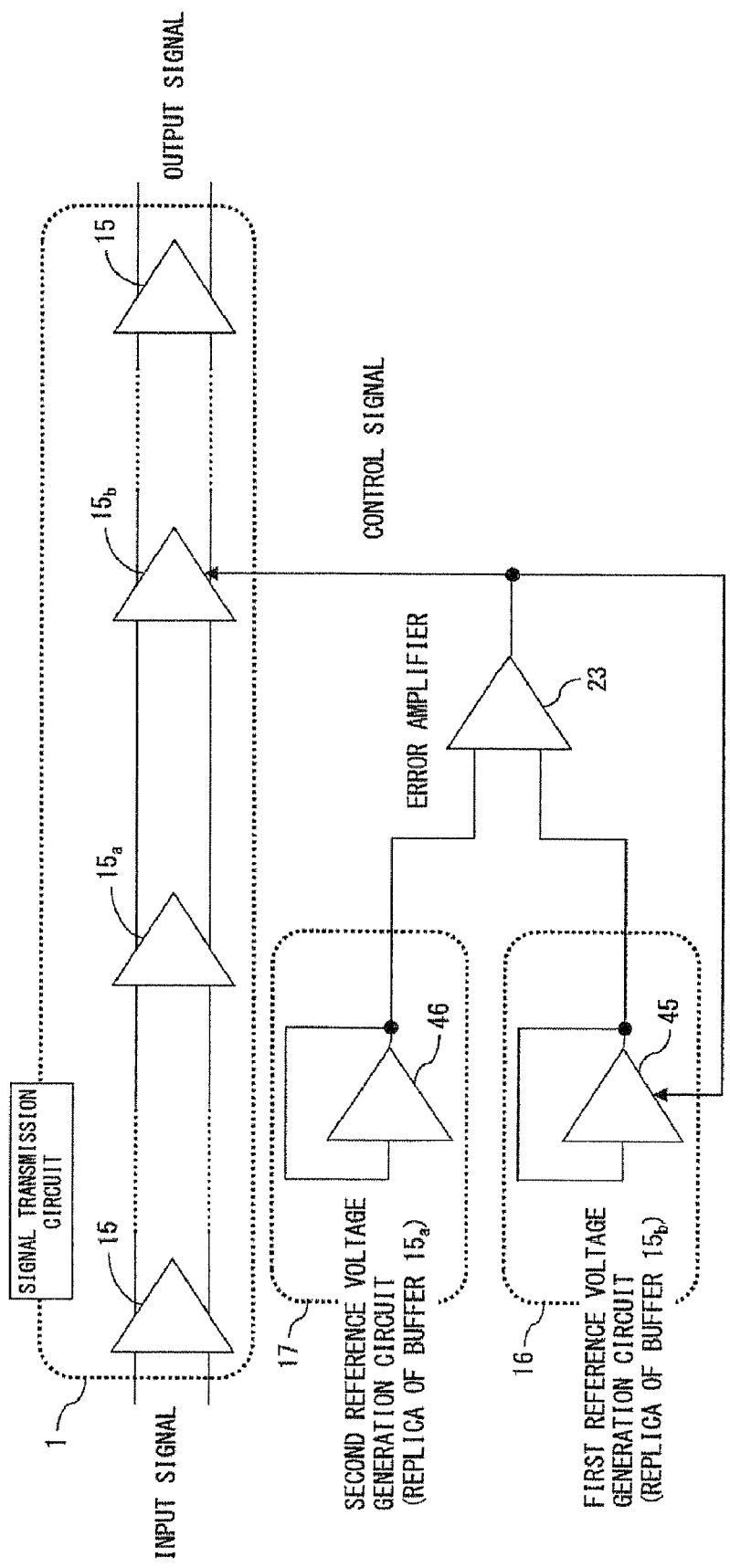
F I G. 11

COMMON-MODE VOLTAGE CONTROLLER

CROSS REFERENCE TO RELATED APPLICATION

This application is a continuation of PCT application PCT/JP2005/017197 filed on Sep. 16, 2005.

BACKGROUND OF THE INVENTION

1. Field of the Invention

The present invention relates to a method for adjusting a common-mode voltage in a signal transmission system.

2. Description of the Related Art

The performance of components constituting information processing apparatuses that include a computer has been greatly improved. Along with performance improvements in static random access memory (SRAM), dynamic random access memory (DRAM), processors, switch-use large scale integration (LSI) and such, improvements in the signal transmission speed between these components, and between elements, have become vital for improving the performance of the entirety of a system. For instance, the speed gap between a processor and memory, such as SRAM and DRAM, is becoming larger, so that the speed gap has become an obstacle to the improvement in performance of computers in recent years. Also associated with the enlargement of a chip, not only the aforementioned signal transmission but also the signal transmission speed between elements and between circuit blocks within the chip has become a large factor limiting the performance of the chip.

In the transmission of a signal of high-frequency data, an important cause of degradation of a signal waveform is fluctuations in a common-mode voltage. The common-mode voltage is generally caused by a line voltage being separated into a common-mode component and a differential mode component when a parallel transmission line is placed in parallel with a ground surface close thereto and excited. When, for example, transmitting a signal between circuits with different common-mode voltages, an output common-mode voltage of an output buffer at a circuit of a preceding stage is preferably close to a common-mode voltage of an input buffer at a circuit of a subsequent stage; otherwise, if those common voltages are significantly different from each other, the timing accuracy of a signal, expressed by skew and jitter, is degraded, making it difficult to maintain the quality of a propagation signal.

The conventional example of a method for adjusting the common-mode voltage in such a signal transmission circuit is described as follows by referring to FIGS. 14 through 17. FIG. 14 is a diagram describing a conventional example. Referring to FIG. 14, the assumption here is that a common-mode voltage is adjusted between a buffer $101_a$ and a buffer $101_b$ at a subsequent stage among a plurality of buffers 101 included in a signal transmission circuit 100.

In the first conventional example shown in FIG. 14, an output common-mode voltage of buffer $101_a$ is detected, by a common-mode voltage detection circuit 102, from a transmission path within the signal transmission circuit 100, in which, for example, a differential signal is transmitted. If a semiconductor element constituting the signal transmission circuit 100 is, for example, a complementary metal oxide semiconductor (CMOS) element, an approximately intermediate value between the "H" and "L" of a voltage level is detected as a common-mode voltage. The detected voltage is input into an error amplifier 104 and compared with a reference voltage generated by a reference voltage generation circuit 103. The reference voltage is a voltage deemed to be preferable to buffer $101_b$ at the subsequent stage; a control signal corresponding to a difference between the two voltages is fed back to buffer $101_a$ by the error amplifier 104; and a feedback operation is performed so that the voltage detected by the common-mode voltage detection circuit 102 matches the voltage generated by the reference voltage generation circuit 103.

The first conventional example, however, is faced with the problem of being incapable of adjusting the common-mode voltage adequately because, firstly, only the output common-mode voltage of buffer $101_a$ is monitored. Secondly, it is faced with the problem of bringing about the degradation of a signal transmission band resulting from the existence of the common-mode voltage detection circuit 102 affecting the signal transmission in the signal transmission circuit. Thirdly, the common-mode voltage detection circuit 102 often employs an RC filter constituted by, for example, a resistor and a capacitance, thus making it difficult to secure stability in a third-order system feedback loop constituted by three circuits, i.e., the aforementioned RC filter, error amplifier 104 and buffer $101_a$.

FIG. 15 is a diagram describing a second conventional example. The second conventional example is configured to connect an input and output of a buffer $101_b$ of a transmission path of a differential signal by a low-impedance element 105 such as a resistor, thereby forcibly setting the operation point of buffer $101_b$ at a voltage deemed to be most preferable to buffer $101_b$, that is, the operation point producing the largest gain. The second conventional example, however, is faced with the problem of an input impedance of buffer $101_b$ decreasing, resulting in deforming an output waveform of buffer $101_a$.

FIGS. 16 and 17 are diagrams describing the third and fourth conventional examples of common-mode voltage adjustment methods. These conventional examples are configured to cut a direct current (DC) component by inserting capacitances 106 in transmission paths of a differential signal between buffer $101_a$ and buffer $101_b$, thereby setting a common-mode voltage on buffer $101_b$ side.

In the third conventional example shown in FIG. 16, the reference voltage generation circuit 103 gives a reference voltage so as to forcibly set the operation point of buffer $101_b$ to the operation point producing the highest gain. Impedances 107 are inserted to prevent influence on the transmission path.

The fourth conventional example shown in FIG. 17 is configured to connect impedances 105 between the input and output of buffer $101_b$ as in the second conventional example of FIG. 15, thereby forcibly setting the output common-mode voltage of buffer $101_b$ at an operation point producing the highest gain. The third and fourth conventional examples are configured to insert capacitances 106 in the transmission path, causing a low-frequency component of the signal to be unable to pass through if the frequency range of the input signal is wide, which sometimes generates a problem.

SUMMARY OF THE INVENTION

A common-mode voltage controller according to the present invention is a controller for adjusting common-mode voltages between one buffer and a buffer at a subsequent stage or at a preceding stage of the one buffer in a signal transmission circuit, comprising a first reference voltage generation unit, a second reference voltage generation unit, and a control signal generation unit.

The first reference voltage generation unit is for generating a common-mode voltage corresponding to the one buffer; the second reference voltage generation unit is for generating a common-mode voltage corresponding to a buffer at the subsequent stage or the preceding stage; and the control signal generation unit is for generating a control signal for controlling a common-mode voltage of the one buffer according to a difference between an output voltage of the first reference voltage generation unit and an output voltage of the second reference voltage generation unit and giving the control signal to the one buffer and first reference voltage generation unit.

BRIEF DESCRIPTION OF THE DRAWINGS

FIG. 1 is a block diagram of the principle configuration of a common-mode voltage controller according to the present invention;

FIG. 6 exemplifies the configuration of a replica circuit 21 according to the first embodiment;

FIG. 11 is a diagram describing a third preferred embodiment of the present invention;

DESCRIPTION OF THE PREFERRED EMBODIMENTS

Figure 2:
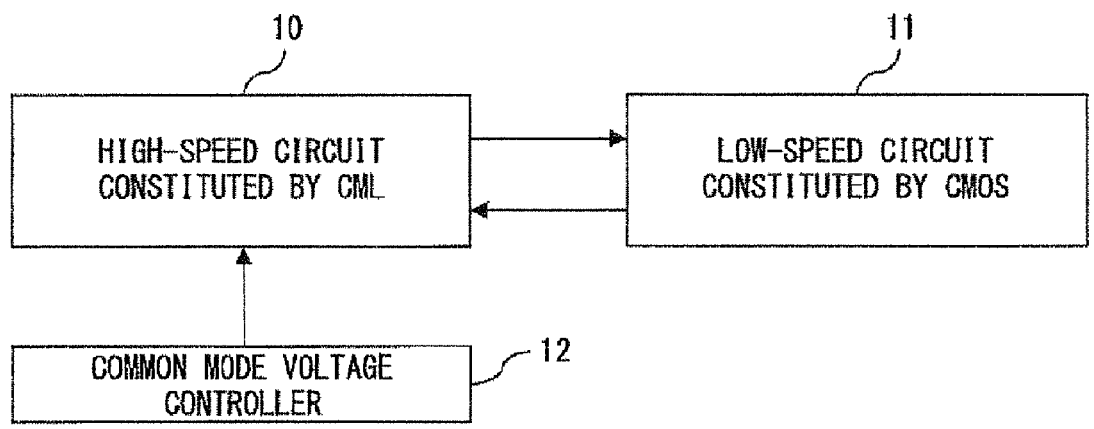
FIG. 2 exemplifies the overall configuration of a signal transmission system employing a common-mode voltage controller according to the present invention.

FIG. 1 is a block diagram of the principle configuration of a common-mode voltage controller according to the present invention. A common-mode voltage controller 2 is a controller for adjusting a common-mode voltage between an one buffer 3 in a signal transmission circuit 1 and a buffer at, for example, a subsequent stage of the one buffer 3.

The common-mode voltage controller 2 comprises a first reference voltage generation unit 5 for generating a common-mode voltage corresponding to the one buffer 3; a second reference voltage generation unit 6 for generating a common-mode voltage corresponding to a buffer 4 at, for example, a subsequent stage; and a control signal generation unit 7 for generating a control signal for controlling a common-mode voltage of the first buffer 3 according to a difference between a voltage that the first reference voltage generation unit 5 outputs and a voltage that the second reference voltage generation unit 6 outputs, and giving the control signal to the one buffer 3 and first reference voltage generation unit 5.

The present invention may be embodied such that the control signal generation unit 7 generates a control signal for lowering the output voltage of the first reference voltage generation unit 5 if the output voltage thereof is higher than that of the second reference voltage generation unit 6 and for raising the output voltage of the first reference voltage generation unit 5 if the output voltage of the first reference voltage generation unit 5 is lower than that of the second reference voltage generation unit 6.

Further, it may be embodied such that the control signal generated by the control signal generation unit 7 is an analog signal that is given to the one buffer 3 and first reference voltage generation unit 5, or that an analog/digital conversion unit, for converting the analog signal generated by the control signal generation unit 7 into a digital signal and giving it to the one buffer 3 and first reference voltage generation unit 5, is further equipped.

Further, the present invention may be embodied such that the control signal generation unit 7 gives an output control signal thereof to one or more buffers at the preceding stage, in addition to giving the control signal to the one buffer 3, when the common-mode voltage is adjusted between the one buffer 3 and a buffer 4 at the subsequent stage as shown in FIG. 1. Alternatively, it may be embodied such that the control signal is further given to one or more buffers at the subsequent stage, in addition to giving the control signal to the one buffer, when the common-mode voltage is adjusted between the one buffer and a buffer at the preceding stage.

Next is a further detailed description of the preferred embodiments of the present invention. FIG. 2 exemplifies the overall configuration of a signal transmission system employing a common-mode voltage controller according to the present invention. In the configuration of FIG. 2, signals are exchanged between a high-speed circuit 10 constituted by current mode logic (CML) and a low-speed circuit 11 constituted by a complementary metal oxide semiconductor (CMOS). Generally, the time margin of a circuit constituted by the CML is small and the margin is further reduced if the common-mode voltage is different from that of a correspondent opposite circuit within the system, thus necessitating the adjustment of the common-mode voltage.

Referring to FIG. 2, a common-mode voltage of the high-speed circuit 10 constituted by the CML is near a power supply voltage, while a common-mode voltage of the low-speed circuit 11 constituted by the CMOS is near the half of the power supply voltage. Generally, the power supply voltage of the high-speed circuit 10 constituted by the CML and that of the low-speed circuit 11 constituted by the CMOS are different; assuming here, however, that these power supply voltages are the same for simplicity, then the common-mode voltages of the two circuits 10 and 11 are clearly different values. As an example, when transmitting a signal from the circuit 10 to the circuit 11, a control for making the output common-mode voltage of the output buffer at the circuit 10 match with an operation point producing the highest possible gain for the input buffer at the circuit 11 is carried out by a common-mode voltage controller 12, and thereby the common-mode voltage is adjusted between the output buffer at the circuit 10 and the input buffer at the circuit 11.

Figure 3:
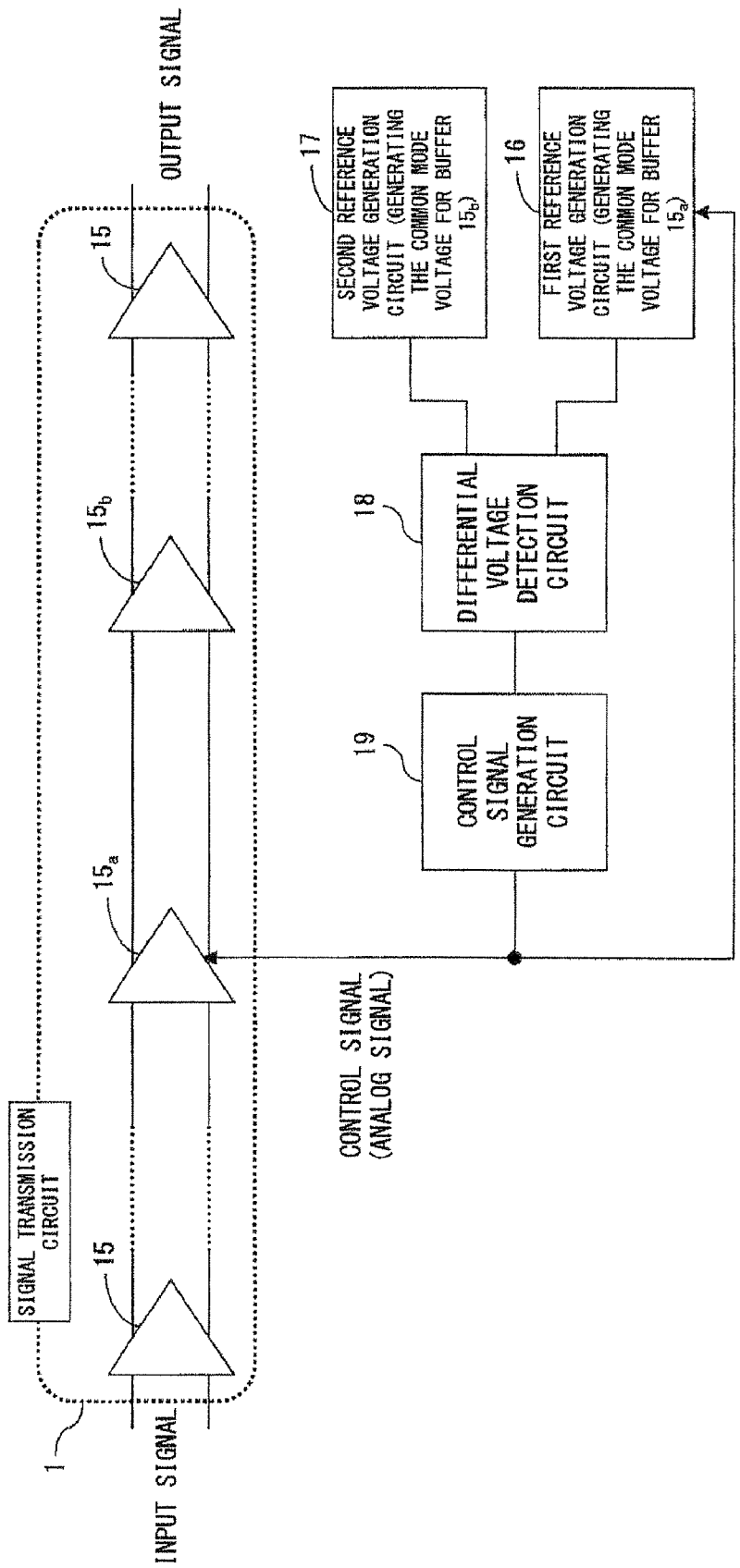
FIG. 3 is a diagram describing the concept of a common-mode voltage adjustment according to the present invention.

FIG. 3 is a diagram describing the basic concept of the present invention. Referring to FIG. 3, the inside of the signal transmission circuit 1 is equipped with a plurality of buffers 15. The basic concept of the present invention is described by exemplifying the adjustment of the common-mode voltage between one buffer 15$_a$ and buffer 15$_b$ at the subsequent stage.

Referring to FIG. 3, a first reference voltage generation circuit 16 is for generating a common-mode voltage corresponding to buffer 15$_a$ and a second reference voltage generation circuit 17 is for generating a common-mode voltage corresponding to buffer 15$_b$. The outputs of the two reference voltage generation circuits 16 and 17 are given to a differential voltage detection circuit 18 and a differential voltage as the detection result is given to a control signal generation circuit 19. A control signal as the output of the control signal generation circuit 19 is given to the first reference voltage generation circuit 16 and buffer 15$_a$. A control signal generation unit noted in claim 1 of the claims of the present invention corresponds to the differential voltage detection circuit 18 and control signal generation circuit 19.

The present invention is embodied such that the common-mode voltage corresponding to the two buffers 15$_a$ and 15$_b$ is given by the two reference voltage generation circuits 16 and 17, in place of a signal path within the signal transmission circuit 1, and therefore the factors causing degradation in the signal transmitted within the signal transmission circuit 1 can be diminished. Further, the equipment of, for example, respective replica circuits of buffers makes it possible to generate a reference voltage more stably.

Figure 4:
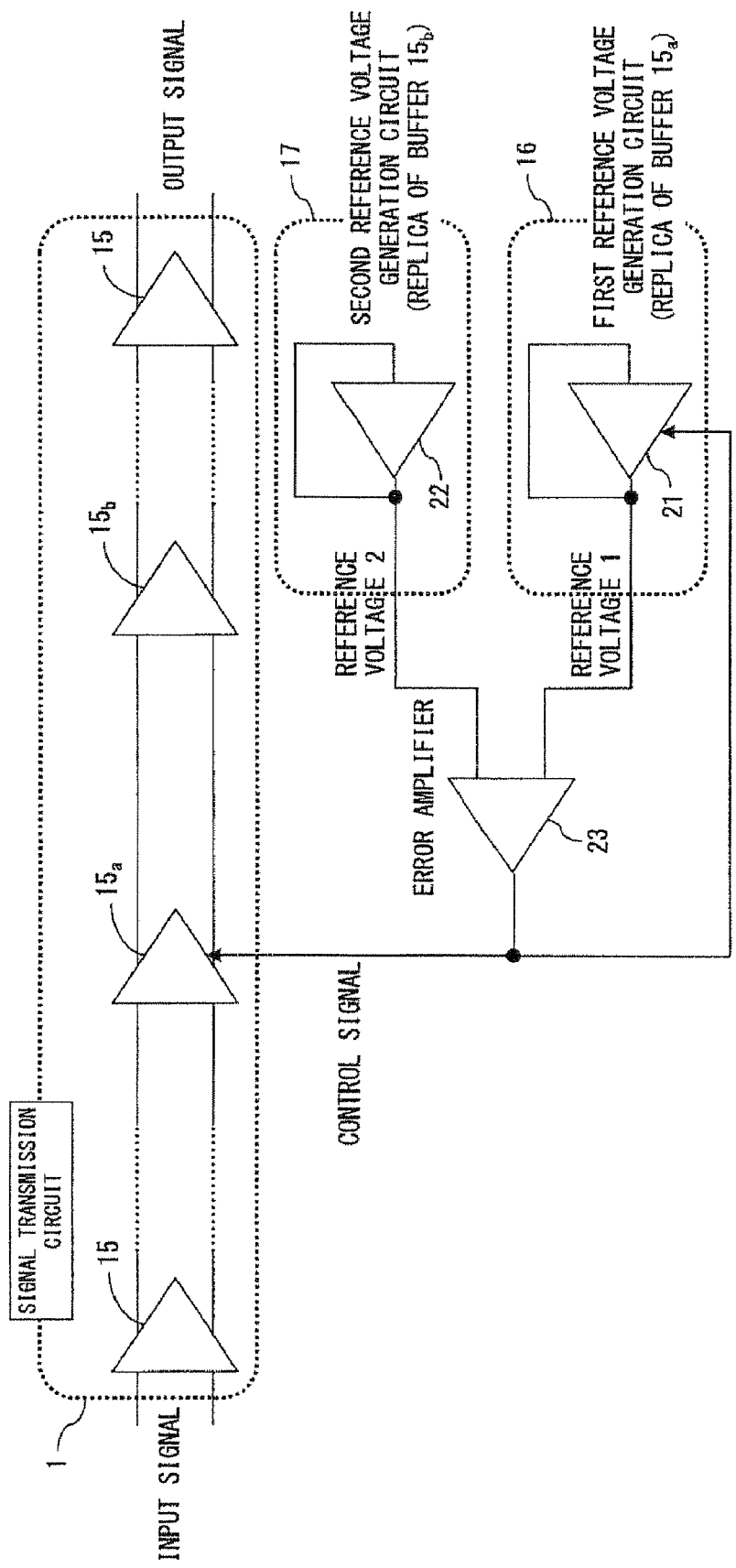
FIG. 4 is a diagram describing a first preferred embodiment of the present invention.

FIG. 4 is a diagram describing a first preferred embodiment of the present invention. Comparing FIG. 4 with the basic concept diagram of the present invention shown in FIG. 3, the first reference voltage generation circuit 16 is constituted by a replica circuit 21 of buffer 15$_a$, the second reference voltage generation circuit 17 is constituted by a replica circuit 22 of buffer 15$_b$, and the differential voltage detection circuit 18 and control signal generation circuit 19 are constituted by a single error amplifier 23.

The first embodiment shown in FIG. 4 is configured to perform a control for raising the voltage of a control signal by the error amplifier 23 if a reference voltage 1 generated by the replica circuit 21 is higher than a reference voltage 2 generated by the replica circuit 22, and a control for lowering the voltage of a control signal if the reference voltage 1 is lower than the reference voltage 2 and give the control signal to the replica circuit 21, thereby performing a feedback operation so as to make reference voltage 1 match reference voltage 2.

Further, the first embodiment is configured to be a second-order system in which the feedback loop is constituted by only the replica circuit 21 and error amplifier 23, and therefore the delay of phase is limited to 180 degrees, making it possible to maintain a stability of operation. That is, the first embodiment of the present invention is configured to use the replica circuit 21 of buffer 15$_a$ as the first reference voltage generation circuit 16, to use the replica circuit 22 of buffer 15$_b$ as the second reference voltage generation circuit 17, to feed back the control signal to the replica circuit 21 so as to make the output common-mode voltage of buffer 15$_a$ match with an operation point producing the highest possible gain for buffer 15$_b$, and to give the control signal to buffer 15$_a$ at the same time, thereby outputting a signal such that buffer 15$_a$ provides the optimal common-mode voltage for the operation of buffer 15$_b$ at the subsequent stage.

Figure 5:
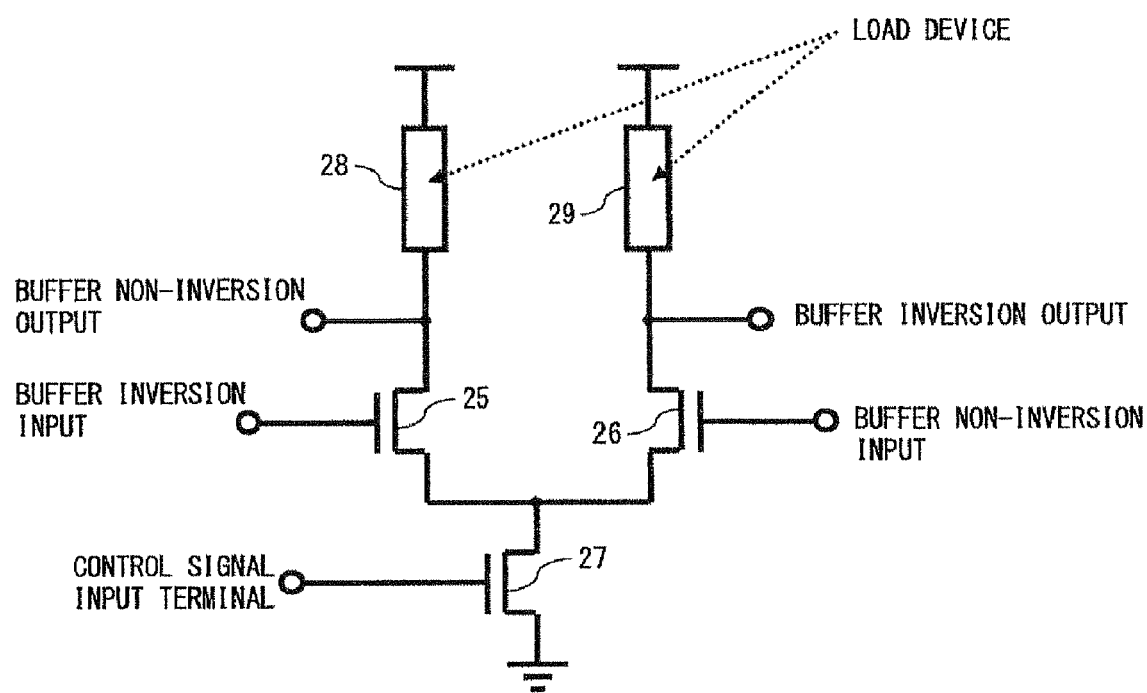
FIG. 5 exemplifies the configuration of a buffer in the first embodiment.

Next is a description of configuration examples of buffers, reference voltage generation circuits and error amplifiers as constituent components for the first embodiment by referring to FIGS. 5 through 8. FIG. 5 is the circuit diagram of a CML buffer as an example of a configuration of buffer 15$_a$. As an example, FIG. 5 shows the case of buffer 15$_a$ being equivalent to the output buffer at the high-speed circuit 10 constituted by CML and that of transmitting a signal to the input buffer at the low-speed circuit 11 constituted by CMOS. Note that this is merely an example and that the present invention is of course applicable also in the case of buffers 15$_a$ and 15$_b$ being in a single circuit block or chip in the configuration of FIG. 3, and the present invention is also applicable if it is possible to input a control signal for controlling the common-mode voltage into either of the two buffers 15$_a$ and 15$_b$.

Referring to FIG. 5, buffer 15$_a$ is constituted by three n-channel MOS transistors 25 through 27, and two load devices 28 and 29. The load device can utilize various devices such as p-channel MOS transistors, resistors and inductors.

In FIG. 5, a (non-inversion) input into the buffer is "H" level if a control signal given to the gate of transistor 27 is "H" and, when an inversion input as the differential signal to the buffer becomes "L", transistor 25 enters the Off state and transistor 26 enters the On state, and no current flows in load device 28 while a current does flow in load device 29, resulting in the non-inversion output becoming "H" and the inversion output thereof becoming "L".

FIG. 6 exemplifies the configuration of the replica circuit 21 shown in FIG. 4. Referring to FIG. 6, the replica circuit 21 is configured to be the same as the CML buffer at FIG. 5, or to change the channel width of, for example, the transistor by the same ratio, and, further, to short the input/output. In FIG. 6, as the voltage value of a control signal given to the gate of transistor 27 increases, the currents flowing in the two load devices 28 and 29 increase and the value of the reference voltage 1 decreases. In this way, if the reference voltage 1 as the output of the replica circuit 21 is high as described for FIG. 4, the reference voltage 1 can be decreased by raising the voltage value of a control signal.

Figure 7:
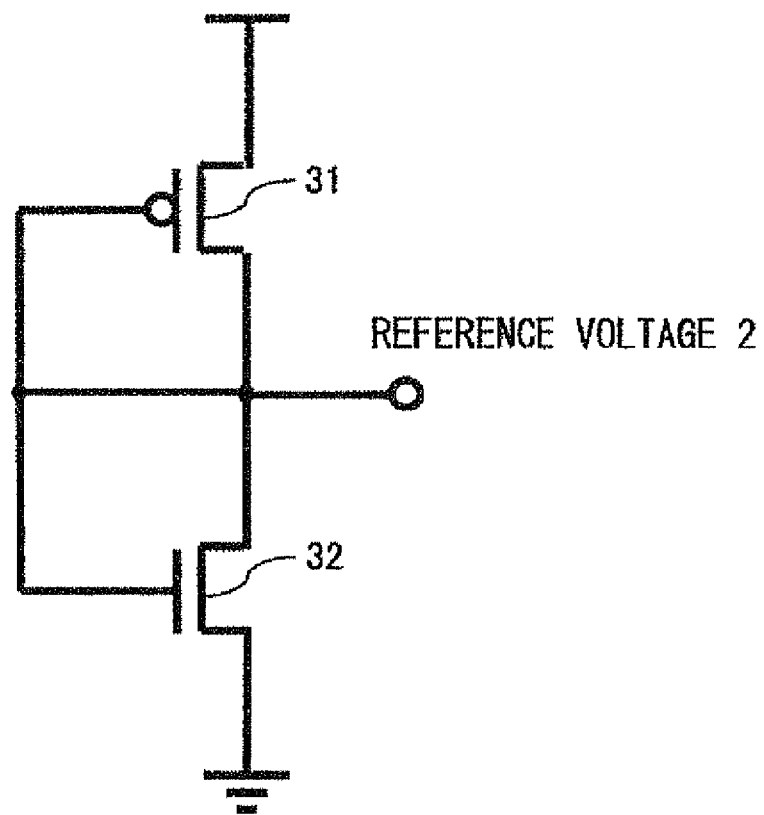
FIG. 7 exemplifies the configuration of a replica circuit 22 according to the first embodiment.

FIG. 7 exemplifies the configuration of the replica circuit 22 shown in FIG. 4. The replica circuit 22 corresponds to buffer 15$_b$, that is, the input buffer at the low-speed circuit 11 constituted by CMOS. The input/output of an inverter that is constituted by, for example, a p-channel MOS transistor 31 and by an n-channel MOS transistor 32, is shorted, by which configuration the value of the reference voltage 2 is approximately the value of one half of the power supply voltage V$_{dd}$ and a common-mode voltage producing the highest possible gain for buffer 15$_b$ is given. It is of course possible to change the channel width of, for example, the two MOS transistors, as in the case of FIG. 6, at the same ratio as the channel width of the transistors constituting buffer 15$_b$.

Figure 8:
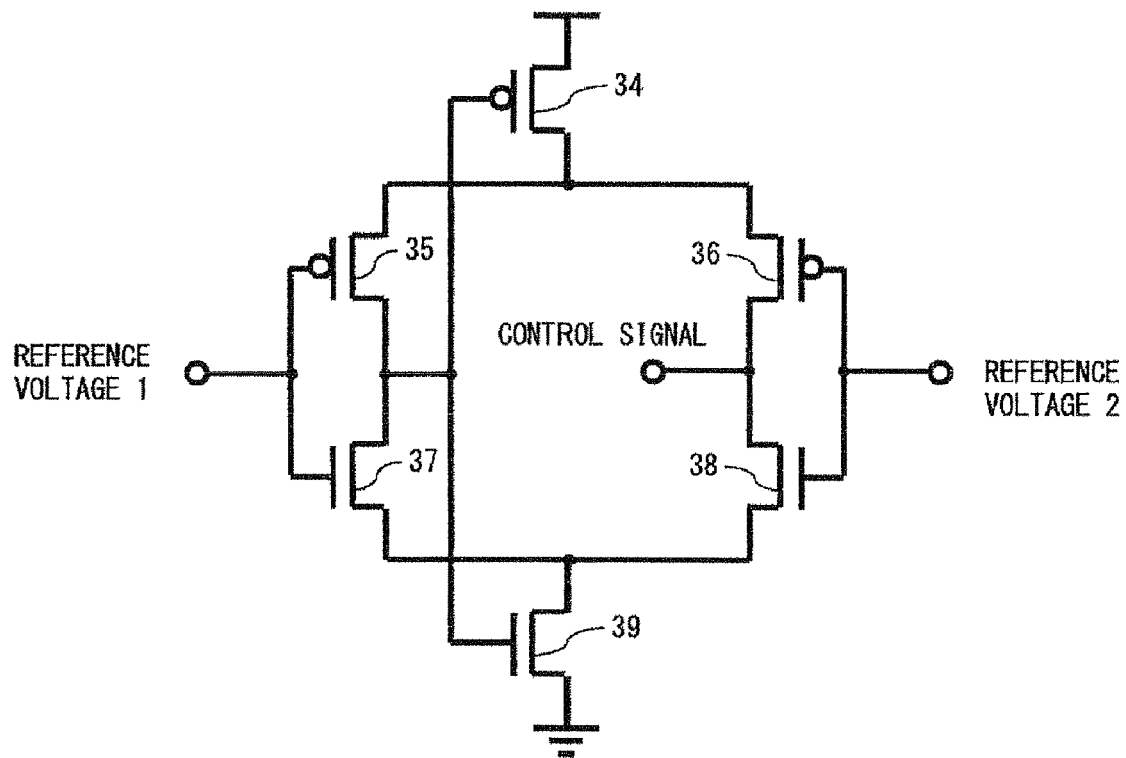
FIG. 8 exemplifies the configuration of an error amplifier according to the first embodiment.

FIG. 8 exemplifies the configuration of the error amplifier 23 shown in FIG. 4. Referring to FIG. 8, the error amplifier 23 is constituted by three p-channel MOS transistors 34 through 36, and three n-channel MOS transistors 37 through 39. If, for example, the value of the reference voltage is large, the n-channel transistor 37 will be in a state close to being conductive, resulting in the potential of the gate of the p-channel transistor 34 being lowered and becoming close to a conductive state, and as a result an operation of increasing the potential of the drain of transistor 34, that is, increasing the value of a control signal as the potential of the drain of transistor 36, is carried out. Note that the error amplifier 23 can of course use a common differential voltage amplifier, in lieu of being limited to the configuration example shown in FIG. 8.

Figure 9:
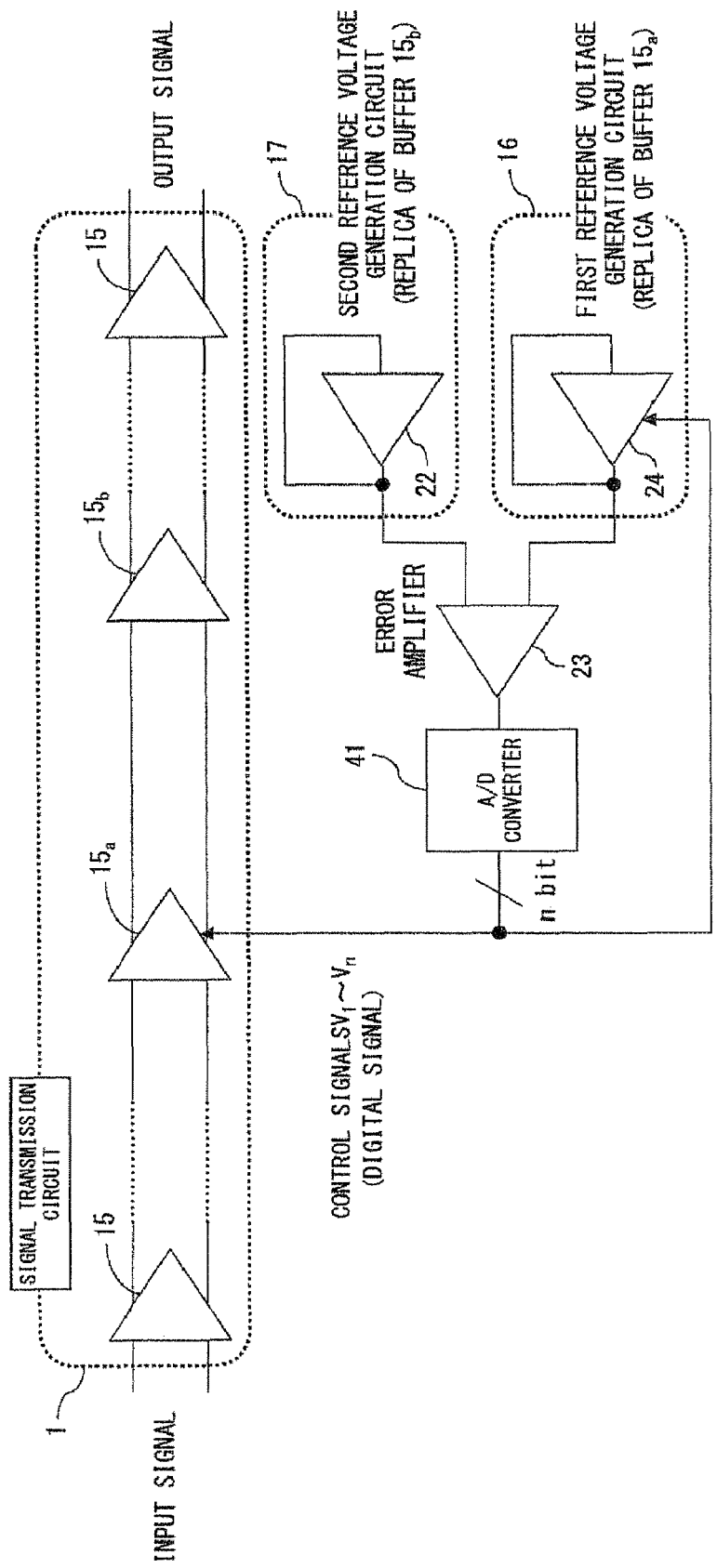
FIG. 9 is a diagram describing a second preferred embodiment of the present invention.

FIG. 9 is a diagram describing a second preferred embodiment of the present invention. Comparing FIG. 9 with FIG. 4 describing the first embodiment, the difference lies in that an A/D converter 41 is equipped between the error amplifier 23 and buffer 15$_a$, and between the error amplifier 23 and replica amplifier 24. That is, the difference is that the first embodiment shown in FIG. 4 is configured to give an analog voltage, as the output of the error amplifier 23, to the gate of the n-channel MOS transistor 27 of FIGS. 5 and 6, as analog bias voltages, respectively, whereas an n-bit signal that has been converted into a digital signal from the analog voltage is given to buffer $15_a$ and replica circuit 24 in the second embodiment of FIG. 9.

Figure 10:
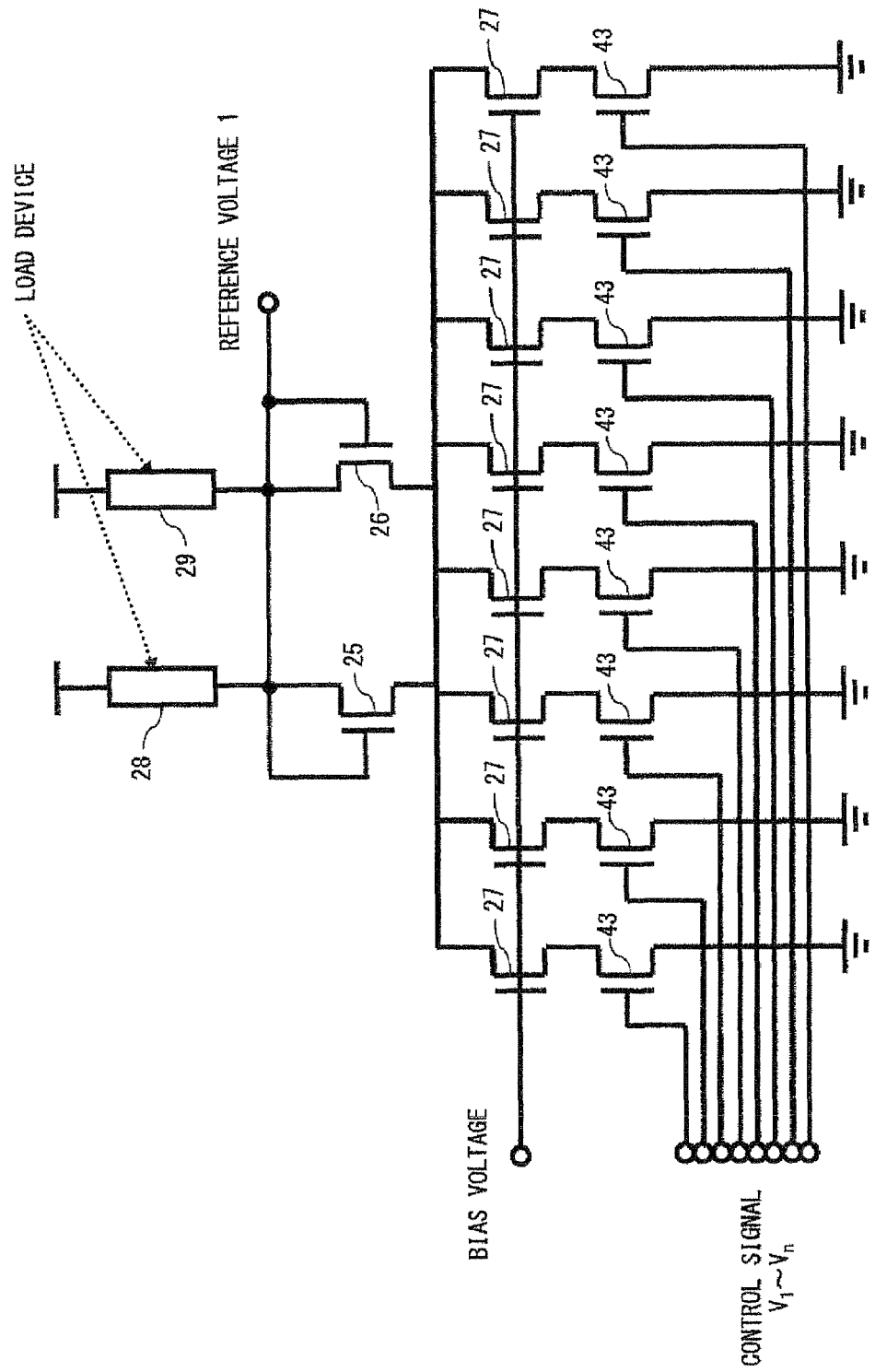
FIG. 10 exemplifies the configuration of a replica circuit 24 according to a second preferred embodiment.

FIG. 10 is a circuit diagram showing the configuration of a replica circuit 24 as the first reference voltage generation circuit 16 according to the second embodiment. In comparison with FIG. 6, which shows the configuration of the replica circuit 21 in the first embodiment, there is a difference in that a plurality of n-channel MOS transistors 27 to which a control signal is input into the gate are parallelly connected, a constant bias voltage is given to the gate of individual transistor 27, another n-channel MOS transistor is connected between the individual transistor 27 and ground, and the value of the individual bit signal of an n-bit digital signal is given to the gate of the individual transistor 43, in the configuration of FIG. 6. As an example, the channel widths of transistors 24 and 43 are changed such that the influence of the value of the signal of the most significant bit (MSB) among the control signal of n bits is at the maximum and such that the influence of the value of the signal of the least significant bit (LSB) is at the minimum, thereby making is possible to adequately perform control by using a digital signal that has been converted from an analog signal. Note that in the second embodiment, buffer $15_a$ is also configured such that transistor 27 of FIG. 5 is configured as shown in FIG. 10, thereby enabling control to be performed by way of a digital signal.

FIG. 11 is a diagram describing a third preferred embodiment of the present invention. The third embodiment is configured to control the common-mode voltage of buffer $15_b$ at a subsequent stage of two buffers $15_a$ and $15_b$. That is, a first reference voltage generation circuit 16 is a replica circuit 45 of buffer $15_b$ at a subsequent stage, a second reference voltage generation circuit 17 is a replica circuit 46 of buffer $15_a$ at a preceding stage, and an error amplifier 23 controls the replica circuit 45 so that the values of the reference voltages as the outputs of the two replica circuits 45 and 46 are equal to each other and also outputs the control signal to buffer $15_b$.

Figure 12:
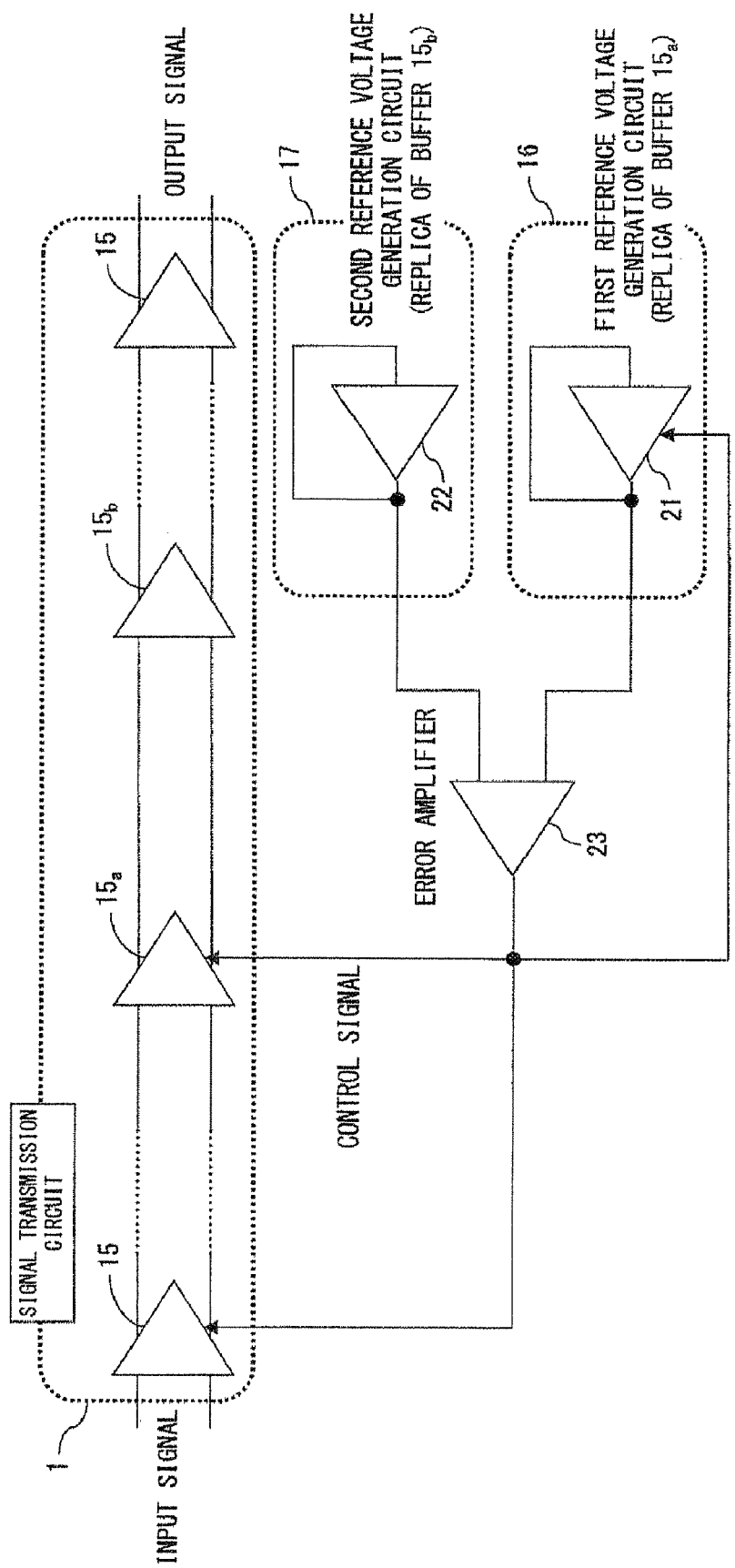
FIG. 12 is a diagram describing a fourth preferred embodiment of the present invention.

FIG. 12 is a diagram describing a fourth preferred embodiment of the present invention. The fourth embodiment is configured to give the output of two replica circuits 21 and 22 to an error amplifier 23 as in the case of the first embodiment shown in FIG. 4, give the control signal output from the error amplifier 23 to buffer $15_a$ and the replica circuit 21, and give the control signal further to a buffer at a preceding stage of buffer $15_a$, that is, commonly to a plurality of buffers at the same time, thereby making it possible to adjust the output common-mode voltage of buffer $15_a$ to the most optimal value for the operation of buffer $15_b$ even when a control for only one-stage of buffer $15_a$ is unable to adjust the common-mode voltage appropriately.

The fourth embodiment shown in FIG. 12 is configured to give the control signal output from the error amplifier 23 further to a buffer at a preceding stage of buffer $15_a$; it is, however, also possible to adjust the common-mode voltage further effectively by not only giving the control signal output from the error amplifier 23 to buffer $15_b$, corresponding to the third embodiment shown in FIG. 11, but also giving the control signal commonly to a plurality of buffers at a subsequent stage.

Figure 13:
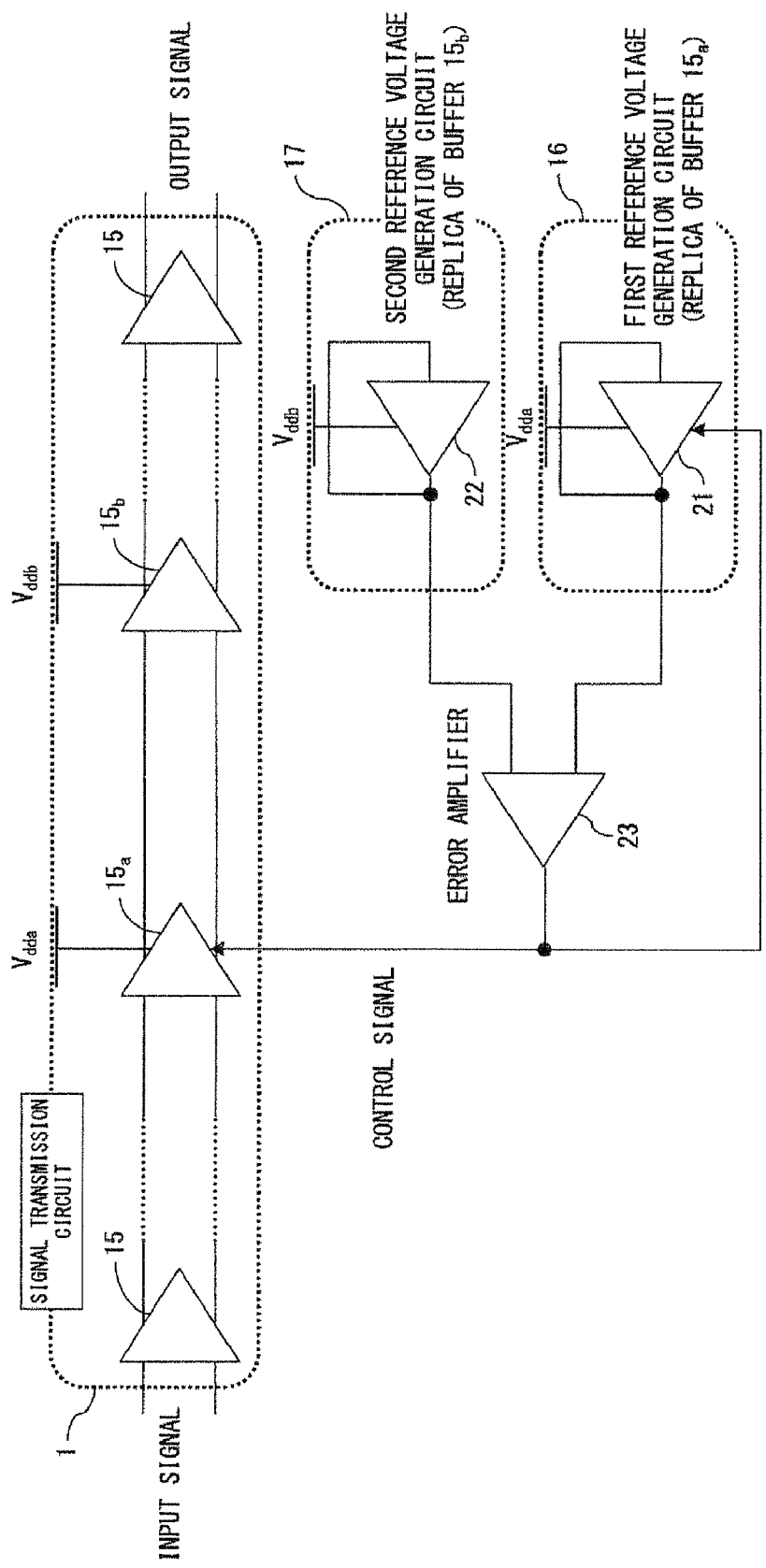
FIG. 13 is a diagram describing a fifth preferred embodiment of the present invention.
Figure 14:
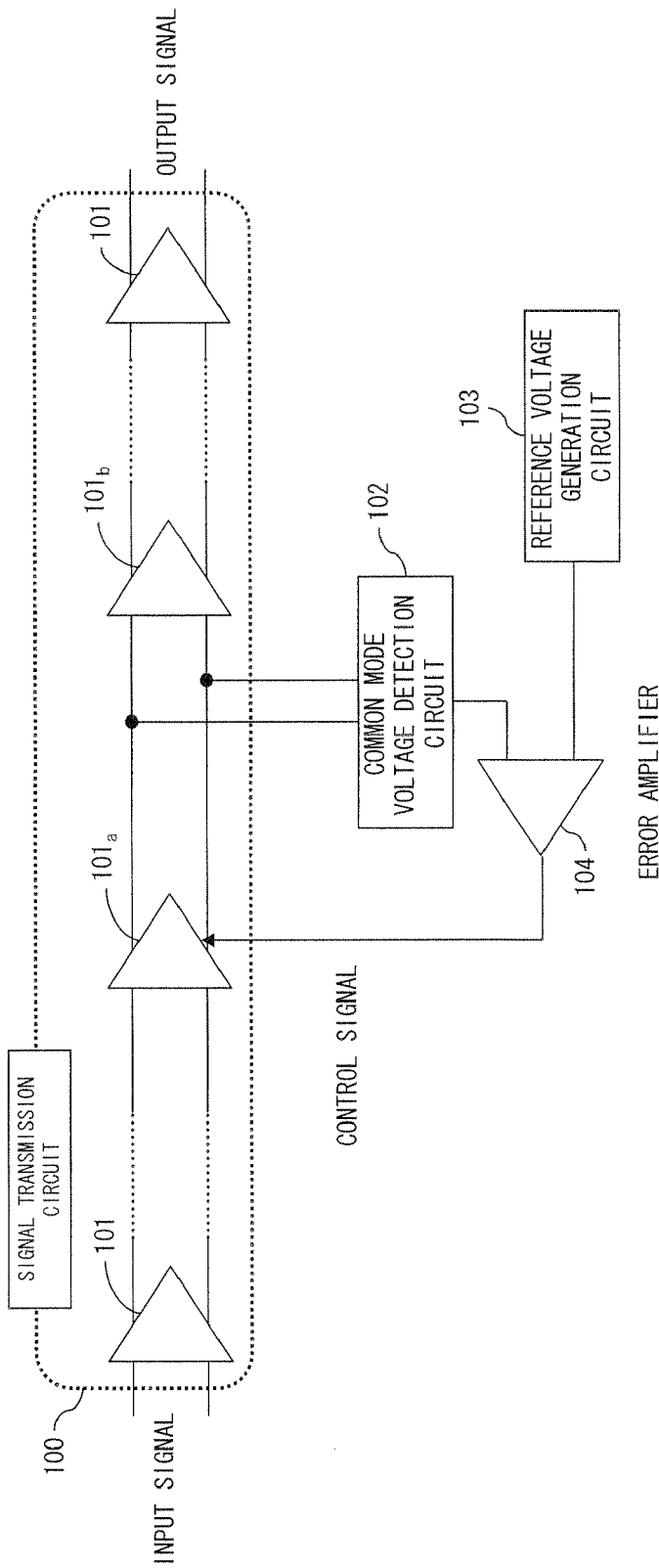
FIG. 14 is a diagram describing a first conventional example of a common-mode voltage adjustment method.
Figure 15:
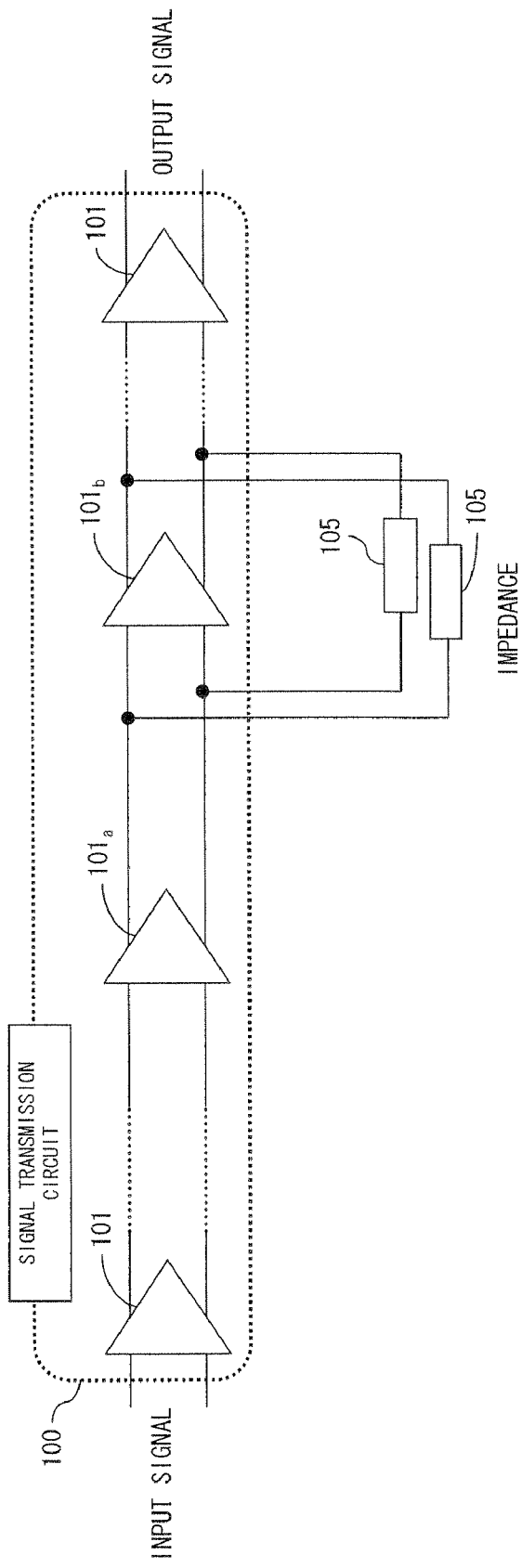
FIG. 15 is a diagram describing a second conventional example of a common-mode voltage adjustment method.
Figure 16:
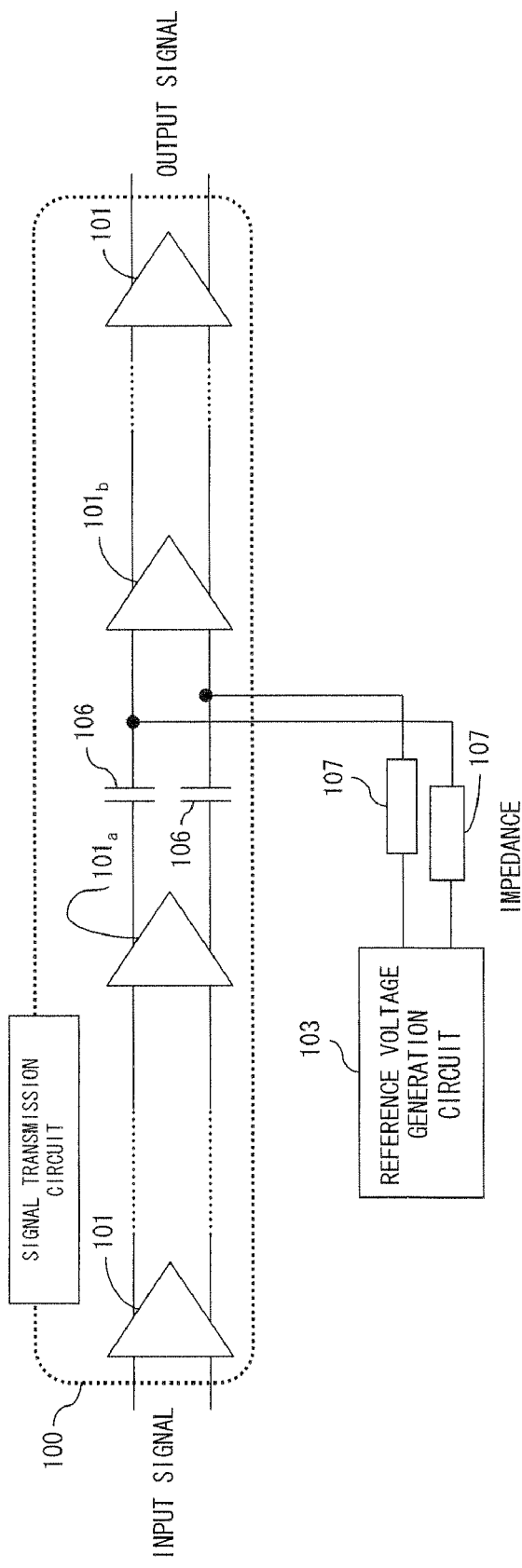
FIG. 16 is a diagram describing a third conventional example of a common-mode voltage adjustment method.
Figure 17:
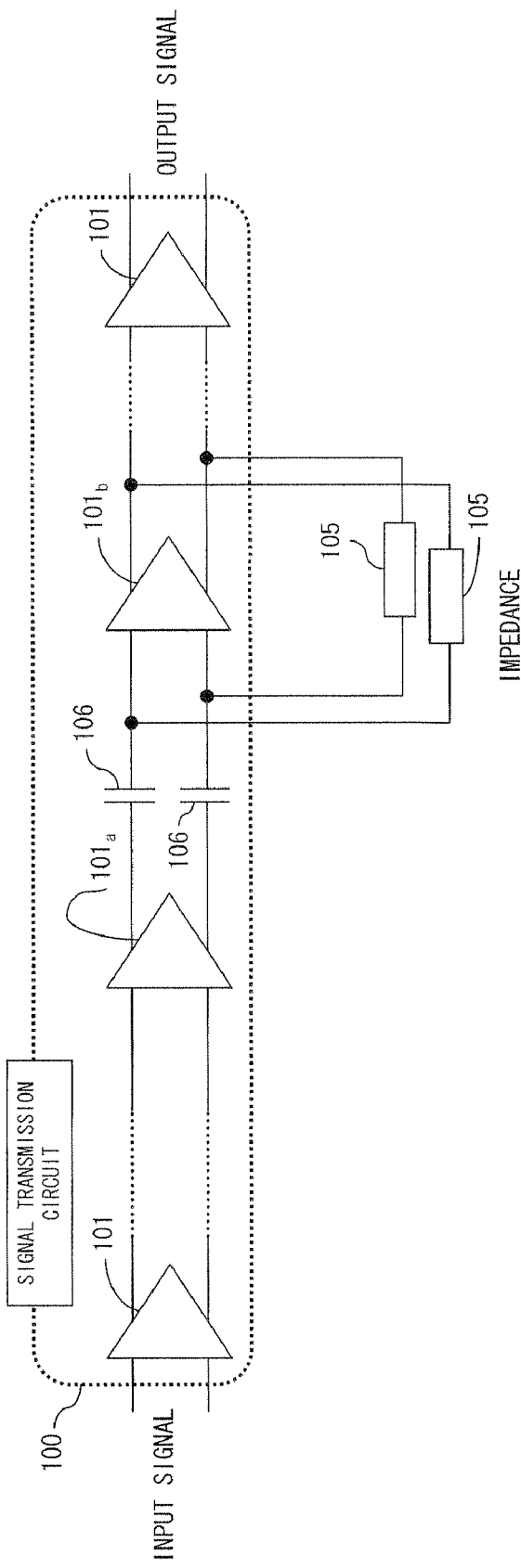
FIG. 17 is a diagram describing a fourth conventional example of a common-mode voltage adjustment method.

FIG. 13 is a diagram describing a fifth preferred embodiment of the present invention. FIG. 13 shows an embodiment in which the power supply voltages for buffers $15_a$ and $15_b$ are different. As described in FIG. 2 as an example, the power supply voltages for the high-speed circuit 10 constituted by the CML and that for the low-speed circuit 11 constituted by the CMOS are commonly different, and FIG. 13 is equivalent to an embodiment suitable to such a case.

Referring to FIG. 13, where the power supply voltage for buffer $15_a$ is Vdda and that for buffer $15_b$ is Vddb, the configuration uses the Vdda as the power supply voltage for the replica circuit 21 and uses the Vddb as that for the replica circuit 22.

As described above in detail, the present invention enables the adjustment of a common-mode voltage without levying an actual load on the transmission path of a signal and makes it possible to set the output common-mode voltage of, for example, a buffer at a preceding stage to an operation point producing the highest possible gain for a buffer at a subsequent stage without influencing the band or amplitude of a transmission signal. The present invention also makes it possible to avoid a shutoff of a low-frequency signal, secure the stability of a system because a feedback loop for adjusting the common-mode voltage is a second-order system, and maintain the signal quality as a result of improving, as much as possible, the timing accuracy (which is expressed by skew and jitter) of a signal transmitted, for example, between circuit blocks with different common-mode voltages, thereby contributing greatly to an improvement in the transmission quality of a high-frequency data signal transmission.

What is claimed is:

1. A common-mode voltage controller comprising:
a first buffer in a signal transmission circuit;
a second buffer arranged a subsequent stage or a preceding stage of the first buffer in a signal transmission circuit;
a first reference voltage generation unit to generate a common-mode voltage corresponding to the first buffer;
a second reference voltage generation unit to generate a common-mode voltage corresponding to the second buffer at the subsequent stage or the preceding stage; and
a control signal generation unit to generate a control signal to control a common-mode voltage of the first buffer according to a difference voltage between an output of the first reference voltage generation unit and an output of the second reference voltage generation unit, and to give the control signal to the first buffer and first reference voltage generation unit, wherein
said control signal generation unit generates a control signal for lowering an output voltage of said first reference voltage generation unit if the output voltage of the first reference voltage generation unit is higher than an output voltage of said second reference voltage generation unit, and for raising the output voltage of the first reference voltage generation unit if the output voltage of the first reference voltage generation unit is lower than the output voltage of the second reference voltage generation unit,
said control signal generated by said control signal generation unit is an analog signal, and
an analog/digital conversion unit for converting said analog signal generated by said control signal generation unit into a digital signal and giving it to said first buffer and first reference voltage generation unit.

2. A common-mode voltage controller for adjusting common-mode voltages between a first buffer and a second buffer at a subsequent stage or a preceding stage of the first buffer in a signal transmission circuit, comprising:
a first reference voltage generation unit for generating a common-mode voltage corresponding to the first buffer;
a second reference voltage generation unit for generating a common-mode voltage corresponding to the second buffer at the subsequent stage or the preceding stage; and a control signal generation unit for generating a control signal for controlling a common-mode voltage of the first buffer according to a difference voltage between an output of the first reference voltage generation unit and an output of the second reference voltage generation unit, and giving the control signal to the first buffer and first reference voltage generation unit, wherein said control signal generation unit outputs a generated control signal further to one or more buffers at a preceding stage of said first buffer when said common-mode voltage is adjusted between the first buffer and the second buffer at said subsequent stage.

3. A common-mode voltage controller for adjusting common-mode voltages between a first buffer and a second buffer at a subsequent stage or a preceding stage of the first buffer in a signal transmission circuit, comprising:

a first reference voltage generation unit for generating a common-mode voltage corresponding to the first buffer;

a second reference voltage generation unit for generating a common-mode voltage corresponding to the second buffer at the subsequent stage or the preceding stage; and a control signal generation unit for generating a control signal for controlling a common-mode voltage of the first buffer according to a difference voltage between an output of the first reference voltage generation unit and an output of the second reference voltage generation unit, and giving the control signal to the first buffer and first reference voltage generation unit, wherein said control signal generation unit outputs a generated control signal further to one or more buffers at a subsequent stage of said first buffer when said common-mode voltage is adjusted between the first buffer and the second buffer at said preceding stage.

4. The common-mode voltage controller according to claim 1, wherein said first buffer is equipped in a high-speed circuit of a current mode logic system, and said second buffer at said preceding stage or subsequent stage is equipped in a low-speed circuit employing a complementary metal oxide semiconductor element.

5. The common-mode voltage controller according to claim 1, wherein said first reference voltage generation unit operates on the power supply voltage of said one buffer, or said second reference voltage generation unit operates on the power supply voltage of said second buffer at said subsequent stage or preceding stage if the power supply voltage of the first buffer is different from that of the second buffer at the subsequent stage or preceding stage.

6. A common-mode voltage controller for adjusting common-mode voltages between a first buffer and a second buffer at a subsequent stage of the first buffer in a signal transmission circuit, comprising:

a first reference voltage generation unit for generating a common-mode voltage corresponding to the second buffer;

a second reference voltage generation unit for generating a common-mode voltage corresponding to the first buffer; and a control signal generation unit for generating a control signal for controlling a common-mode voltage of the second buffer according to a difference voltage between an output of the first reference voltage generation unit and an output of the second reference voltage generation unit, and giving the control signal to the second buffer and first reference voltage generation unit.

7. The common-mode voltage controller according to claim 6, wherein said second reference voltage generation unit is constituted by a replica circuit of said first buffer, and said first reference voltage generation unit is constituted by a replica circuit of said second buffer at said preceding stage or subsequent stage.

8. The common-mode voltage controller according to claim 7, wherein respective inputs and outputs are shorted in said replica circuit of said first buffer and said replica circuit of said preceding stage or subsequent stage.

* * * * *